United States Patent
Matayabas, Jr.

(10) Patent No.: US 6,974,728 B2
(45) Date of Patent: Dec. 13, 2005

(54) ENCAPSULANT MIXTURE HAVING A POLYMER BOUND CATALYST

(75) Inventor: James Christopher Matayabas, Jr., Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/731,852

(22) Filed: Dec. 8, 2003

(65) Prior Publication Data

US 2005/0124785 A1    Jun. 9, 2005

(51) Int. Cl.$^7$ ............................................. H01L 21/48
(52) U.S. Cl. .................................................... 438/127
(58) Field of Search ..................... 438/106, 112, 124, 438/126, 127

(56) References Cited

U.S. PATENT DOCUMENTS

| | | | |
|---|---|---|---|
| 5,610,443 A | * | 3/1997 | Inagaki et al. ............... 257/788 |
| 5,855,821 A | | 1/1999 | Chau et al. |
| 6,309,916 B1 | * | 10/2001 | Crowley et al. ............ 438/127 |

FOREIGN PATENT DOCUMENTS

| | | |
|---|---|---|
| JP | 59036126 | 6/1984 |
| JP | 2001220429 | 4/2001 |
| WO | WO 9627641 | 9/1996 |
| WO | PCT/US2004/039640 | 11/2004 |

* cited by examiner

Primary Examiner—Scott Geyer
(74) Attorney, Agent, or Firm—Blakely, Sokoloff, Taylor & Zafman LLP

(57) ABSTRACT

A method of constructing a microelectronic assembly as provided. A mold piece is locating over a microelectronic die carrying an integrated circuit. An encapsulant is injected into a space defined between surfaces of the mold piece and the microelectronic die. The encapsulant includes a liquid phase epoxy and a solid phase catalyst compound when injected. The encapsulant mixture is heated in the space to a temperature where the catalyst compound becomes a liquid and cures the epoxy. The catalyst compound may, for example, be polystyrene and the catalyst may be diphenyl phosphine. The catalyst compound is then heated to above its glass transition temperature so that the diphenyl phosphine is released from the polystyrene. The diphenyl phosphine then cures the epoxy. The epoxy is preferably a liquid at room temperature.

16 Claims, 1 Drawing Sheet

ENCAPSULANT MIXTURE HAVING A POLYMER BOUND CATALYST

BACKGROUND OF THE INVENTION

1). Field of the Invention

This invention relates generally to a method of constructing a microelectronic assembly, and more specifically to an encapsulant mixture that is used to form a mold over a microelectronic die of the assembly.

2). Discussion of Related Art

Integrated circuits are usually manufactured on wafer substrates. Such a wafer substrate is then "singulated" or "diced" into individual dies, each die carrying a respective integrated circuit. Such a die is then usually mounted on a substrate. The substrate provides structural rigidity to the entire assembly and has conductive lines for transmitting signals to and from the integrated circuit. An encapsulant is then formed over the die to protect the die and further rigidify the entire assembly.

An encapsulant is usually formed by locating a mold piece over the microelectronic die and then injecting an encapsulant mixture into a space defined between surfaces of the mold piece and the microelectronic die. The mold piece is removed after the encapsulant mixture is cured.

Existing encapsulant mixtures make use of an epoxy resin and highly reactive catalysts, such as triphenyl phosphine. Latent curing catalysts typically rely upon the use of one or more bulky ligands that sterrically hinder the catalyst, thereby reducing activity at all temperatures. In order to overcome slower polymerization rates resulting from the use of such ligands, higher concentrations of the catalyst are required. Higher concentrations of catalyst increases cost. Higher concentrations of catalyst also increases the overall activity of the catalyst and thereby reduces the latent effect of the catalyst.

BRIEF DESCRIPTION OF THE DRAWINGS

The invention is described by way of examples with reference to the accompanying drawings wherein.

DETAILED DESCRIPTION OF THE INVENTION

Figure 1:
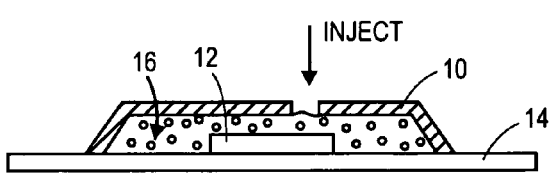
FIG. 1 is a cross-sectional side view illustrating how an encapsulant mixture of an embodiment of the invention is injected into a space defined between a mold piece and a die.

A method of constructing a microelectronic assembly is provided. As illustrated in FIG. 1, a mold piece 10 is located over a microelectronic die 12. The microelectronic die 12 is mounted on a package substrate 14. The microelectronic die 12 carries an integrated circuit and is electrically connected to electric conductors in the substrate 14. An encapsulant mixture 16 is injected into a space defined between surfaces of the mold piece 10, microelectronic die, and substrate 14.

Figure 2:
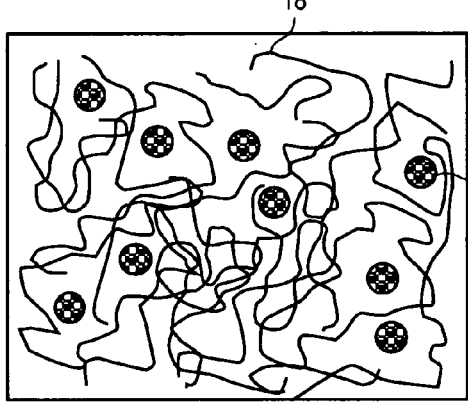
FIG. 2 is an enlarged view representing the encapsulant mixture.
Figure 3:
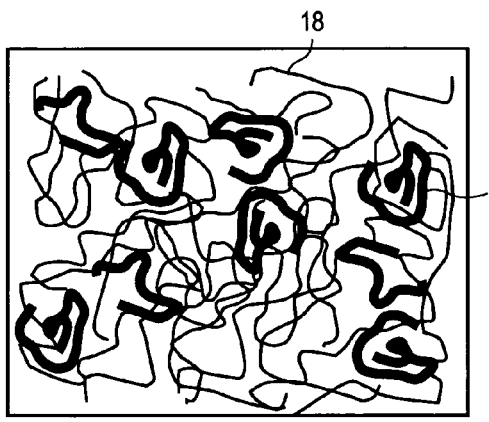
FIG. 3 is a view similar to FIG. 2 after a catalyst compound of the encapsulant mixture is heated so that it becomes a liquid and cures an epoxy of the encapsulant mixture.
Figure 4:
FIG. 4 is a view similar to FIG. 1 after the encapsulant mixture is cured and the mold piece is removed.

As illustrated in FIG. 2, the encapsulant mixture 16 includes a liquid phase epoxy 18 and a solid phase catalyst compound 20. The encapsulant mixture 16 in the space is then heated to a temperature where the catalyst compound 20 becomes a liquid. As illustrated in FIG. 3, the liquid catalyst compound 20 then cures the epoxy 18. As further illustrated in FIG. 4, the mold piece 10 of FIG. 1 is removed so that the cured encapsulant mixture forms an encapsulant 22 over the die 12.

It can thus be seen that the catalyst compound 20 remains non active until the encapsulant mixture 16 is injected and heated to above the temperature at which the catalyst compound 20 becomes liquid. While in this state, the catalyst compound has surface activity only, which means that there is very little catalyzation, so that the encapsulant mixture 16 is stable and has a long shelf life.

The catalyst compound may for example include a polymer and a catalyst bound to the polymer. The catalyst is then released from the polymer when the catalyst compound is heated to above its glass transition temperature. The released catalyst then cures the epoxy.

A wide variety of epoxy resins may be used in the practice of this invention. Examples of useful epoxy resins includes bis(4-glycidyloxyphenyl)methane (Tm=−15° C.), poly[(o-cresyl glycidl ether)-co-formaldehyde] (Tm=37° C.), 4,4'-isopropylidenediphenol diglycidyl ether (Tm=40° C.), 3,5,3',5'-tetramethyldiphenyl 4,4'-diglycidyl ether (Tm=90° C.), and the like or their mixtures. The preferred epoxy resins are those that are liquid below about 100° C.

Figure 5:
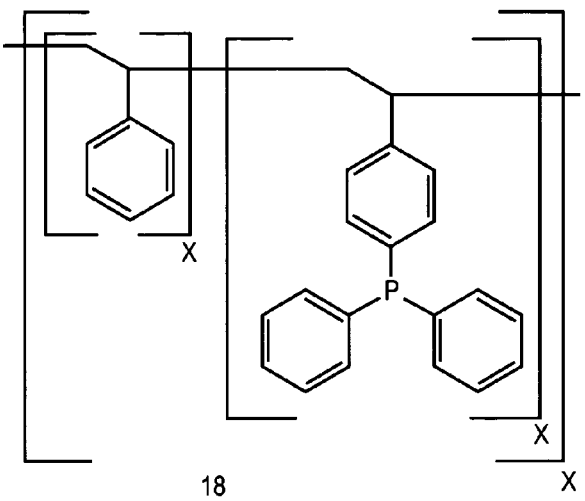
FIG. 5 is a chemical structure of a catalyst compound that may be used in an encapsulant mixture according to an embodiment of the invention.

A wide variety of polymers may be used in the practice of this invention, provided that the polymer becomes liquid at a temperature that is greater than the melting point of the resin. The preferred polymers becomes liquid at a temperature above about 100° C. The polymer may include an olefin, a polyester, a polyamide, a polyamine, or a polyether. Examples of useful polymers include polystyrene, polyacrylates, polybutyleneterephthalate, polyhexamethylene adipamide, and polyphenylene ether. As illustrated in FIG. 5, the polymer bound catalyst may for example be polystyrene bound diphenyl phosphine. The polystyrene bound diphenyl phosphine may optionally be lightly crosslinked with divinylbenzene.

The catalyst compound may include a catalyst which is less active than triphenyl phosphine of the same mass fraction at 120 degrees C. The catalyst may be approximately as active as triphenyl phosphine of the same mass fraction at 160 degrees C.

The epoxy is preferably a liquid below 30 degrees C., more preferably a liquid below 22 degrees C. An epoxy that is liquid at a relatively low temperature can be injected at a relatively low temperature.

COMPARATIVE EXAMPLE

An encapsulant mixture is prepared by (1) dry blending in a blender having a grinding blade with cooling to maintain the temperature below 25 degrees C. 9.60 grams of epoxilated tetramethyl biphenyl, 10.85 grams of novalak resin (comprising 0.50 equivalent per gram), 79 grams of silica, 0.3 grams of carnauba wax, 0.2 grams of 3,4-epoxypropyl trimetheoxy silane, 0.05 gram of triphenyl phosphine, and (2) roll milling the mixture at 110 degrees C. The resulting material is then ground and pressed into a pellet. A die is over molded by transfer molding at 165 degrees C.

EXAMPLE

A mold compound formulation is prepared by (1) dry blending in a blender having a grinding blade with cooling to maintain the temperature below 25 degrees C. 8.22 grams of epoxilated tetramethyl biphenyl, 9.28 grams of novalak resin (comprising 0.50 equivalent per gram), 79 grams of silica, 0.3 grams of carnauba wax, 0.2 grams of 3,4-epoxypropyl trimetheoxy silane, and 3 grams of polystyrene bound diphenyl phosphine (2 mmoles per gram), and (2) roll milling the mixture at 110 degrees C. The resulting material is ground and pressed into a pellet. A die is over molded by transfer molding at 165 degrees C.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of constructing a microelectronic assembly, comprising:
   locating a mold piece over a microelectronic die carrying an integrated circuit;
   injecting an encapsulant mixture into a space defined between surfaces of the mold piece and the microelectronic die, the encapsulant mixture including a liquid phase epoxy and a solid phase catalyst compound when injected, the catalyst compound including a polymer and a catalyst bound to the polymer; and
   heating the encapsulant mixture in the space to a temperature where the catalyst compound becomes a liquid and cures the epoxy.

2. The method of claim 1, wherein the polymer is polystyrene.

3. The method of claim 1, wherein the catalyst is diphenyl phosphine.

4. The method of claim 1 wherein the catalyst compound includes a catalyst which is less active than triphenyl phosphine of the same mass fraction at 120 degrees C.

5. The method of claim 4 wherein the catalyst is approximately as active as triphenyl phosphine of the same mass fraction at 160 degrees C.

6. The method of claim 1 wherein the epoxy includes at least one of bis(4-glycidyloxyphenyl)methane (Tm=−15° C.), poly[(o-cresyl glycidl ether)-co-formaldehyde] (Tm=37° C.), 4,4'-isopropylidenediphenol diglycidyl ether (Tm= 40° C.), 3,5,3',5'-tetramethyldiphenyl 4,4'-diglycidyl ether (Tm=90° C.).

7. The method of claim 1 wherein the epoxy is a liquid at 22 degrees C.

8. The method of claim 7 wherein the epoxy is a liquid at 30 degrees C.

9. The method of claim 7 wherein the epoxy includes bis(4-glycidyloxyphenyl)methane (Tm=−15° C.).

10. The method of claim 1, further comprising removing the epoxy from the mold piece after the epoxy is cured.

11. A method of constructing a microelectronic assembly, comprising:
    locating a mold piece over a microelectronic die carrying an integrated circuit;
    injecting an encapsulant mixture into a space defined between surfaces of the mold piece and the microelectronic die, the encapsulant mixture including a liquid phase epoxy and a solid phase polystyrene-bound diphenyl phosphine catalyst compound; and
    heating the encapsulant mixture in the space to above a glass transition temperature of the polystyrene so that the diphenyl phosphine cures the epoxy.

12. The method of claim 11 wherein the epoxy is a liquid at 22 degrees C.

13. The method of claim 12 wherein the epoxy includes bis(4-glycidyloxyphenyl)methane (Tm=−15° C.).

14. A method of constructing a microelectronic assembly, comprising:
    locating a mold piece over a microelectronic die carrying an integrated circuit;
    injecting an encapsulant mixture into a space defined between surfaces of the mold piece and the microelectronic die, the encapsulant mixture including a liquid phase epoxy and a solid phase catalyst compound when injected, the catalyst being less active than triphenyl phosphine of the same mass fraction at 120 degrees C.; and
    heating the encapsulant mixture in the space to a temperature where the catalyst compound becomes a liquid and cures the epoxy.

15. A method of constructing a microelectronic assembly, comprising:
    locating a mold piece over a microelectronic die carrying an integrated circuit;
    injecting an encapsulant mixture into a space defined between surfaces of the mold piece and the microelectronic die, the encapsulant mixture including a liquid phase epoxy, the epoxy including at least one of bis(4-glycidyloxyphenyl)methane (Tm=−15° C.), poly[(o-cresyl glycidl ether)-co-formaldehyde](Tm=37° C.), 4,4'-isopropylidenediphenol diglycidyl ether (Tm=40° C.), 3,5,3',5'-tetramethyldiphenyl 4,4'-diglycidyl ether (Tm=90° C.), and a solid phase catalyst compound when injected; and
    heating the encapsulant mixture in the space to a temperature where the catalyst compound becomes a liquid and cures the epoxy.

16. A method of constructing a microelectronic assembly, comprising:
    locating a mold piece over a microelectronic die carrying an integrated circuit;
    injecting an encapsulant mixture into a space defined between surfaces of the mold piece and the microelectronic die, the encapsulant mixture including a liquid phase epoxy, the epoxy being a liquid at 22° C., and a solid phase catalyst compound when injected; and
    heating the encapsulant mixture in the space to a temperature where the catalyst compound becomes a liquid and cures the epoxy.

\* \* \* \* \*